(12) United States Patent
Dempsey et al.

(10) Patent No.: US 8,132,061 B2
(45) Date of Patent: *Mar. 6, 2012

(54) REPAIR BITS FOR A LOW VOLTAGE CACHE

(75) Inventors: Morgan J. Dempsey, Phoenix, AZ (US); Jose A. Maiz, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/623,169

(22) Filed: Nov. 20, 2009

(65) Prior Publication Data

US 2010/0070809 A1 Mar. 18, 2010

Related U.S. Application Data

(62) Division of application No. 11/322,988, filed on Dec. 30, 2005, now Pat. No. 7,647,536.

(51) Int. Cl.
*G11C 29/00* (2006.01)

(52) U.S. Cl. ........................................ 714/710; 714/752

(58) Field of Classification Search .................. 714/6, 7, 714/710, 711, 752
See application file for complete search history.

(56) References Cited

U.S. PATENT DOCUMENTS

| | | | |
|---|---|---|---|
| 5,883,904 A * | 3/1999 | Arimilli et al. | 714/710 |
| 6,006,311 A * | 12/1999 | Arimilli et al. | 711/133 |
| 6,055,204 A | 4/2000 | Bosshart | |
| 6,181,614 B1 * | 1/2001 | Aipperspach et al. | 365/200 |
| 6,552,938 B1 | 4/2003 | Anand et al. | |
| 6,671,822 B1 | 12/2003 | Asher et al. | |
| 6,772,383 B1 | 8/2004 | Quach et al. | |
| 6,802,039 B1 | 10/2004 | Quach et al. | |
| 7,162,669 B2 * | 1/2007 | Gross | 714/710 |
| 7,447,948 B2 | 11/2008 | Galbi et al. | |
| 2004/0255209 A1 | 12/2004 | Gross | |
| 2006/0080572 A1 | 4/2006 | Fong | |
| 2006/0156177 A1 | 7/2006 | Kottapalli et al. | |

FOREIGN PATENT DOCUMENTS

WO 2006/039406 A1 4/2006

(Continued)

OTHER PUBLICATIONS

Fong J Y et al. "Nonvolatile Repair Caches Repair Embedded SRAM and New Nonvolatile Memories," Defect and Fault Tolerance in VLSI Systems, DFT Oct. 13, 2004, Proceedings, 19th IEEE Intl Symp, pp. 347-355.

(Continued)

*Primary Examiner* — Esaw Abraham
(74) *Attorney, Agent, or Firm* — David P. McAbee (57) ABSTRACT

A method and apparatus for repairing cache memories/arrays is described herein. A cache includes a plurality of lines and logically viewable in columns. A repair cache coupled to the cache includes a repair bit mapped to each logically viewable column. A repair module determines a bad bit to be repaired within a column based on any individual or combination of factors, such as the number of errors per line of the cache, the number of errors correctable per line of the cache due to error correction code (ECC), the failure rate of bits, or other considerations. The bad bit is transparently repaired by the repair bit mapped to the column including the bad bit, upon an access to a cache line including the bad bit.

14 Claims, 8 Drawing Sheets

FOREIGN PATENT DOCUMENTS

WO     2008/078830 A2     7/2007
WO     2008/078830 A3     8/2007

OTHER PUBLICATIONS

Jien-Chung Lo, "A fault-tolerant associative approach to on-line memory repair," Defect and Fault Tolerance in VLSI, 1994, Proceedings, The IEEE Intl Workshop, IEEE Comput. Soc, Oct. 17, 1994, pp. 168-176.

Clements, Alan, "Microprocessor Systems Design—68000 hardware, software, and interfacing" 1992 PWS-Kent, Boston, title page, copyright page, pp. 452-466.

Office Action Received for Taiwanese Patent Application No. 95147518 mailed on Jan. 20, 2009, 20 Pages of Office Action including english Translation.

Office Action Received for Taiwanese Patent Application No. 95147518 mailed on Oct. 29, 2009, 7 Pages of Office Action including english Translation.

International Preliminary Report on Patentability received for PCT Application No. PCT/US2006/047717, Mailed on Jul. 10, 2008, 8 pages International Search Report and Written Opinion received for PCT Application No. PCT/US2006/047717, Mailed on Jun. 21, 2007, 22 pages

* cited by examiner

| Repair Bits | Bad Bits |
|---|---|
| 438 | 428 |
| 436 | 426 |
| 439 | 429 |
| 437 | 427 |
| 440 | 441 |

REPAIR BITS FOR A LOW VOLTAGE CACHE

The Present Patent Application is a Divisional of application Ser. No. 11/322,988, filed Dec. 30, 2005 now U.S. Pat. No. 7,647,536.

FIELD

This invention relates to the field of cache memories and, in particular, to repairing locations in a cache array.

BACKGROUND

Providing design flexibility in a cache by allowing a variety of size and associativity choices, while maintaining the speed of the cache in locating/storing a requested element, may be highly advantageous for architectures that utilize a cache. However, when dealing with semiconductor technology, power savings become an evermore prevalent concern, which often leads to limiting performance or sacrificing reliability. A typical method to save power, when dealing with cache arrays, includes running the cache arrays at lower voltages than the rest of the device, such as a processor, chipset, or other integrated circuit. Yet, lower voltages may make locations within a cache array more susceptible to soft errors, i.e. flipping of bits that result in an error. Furthermore, locations within the cache are often permanently damaged due to design, manufacture, or after manufacture event, which is often referred to as a hard error.

Traditionally, to correct hard errors, a line of cache including a hard error is replaced by a spare line. In contrast, a soft error is usually correctable by error correction code (ECC) employed by the cache array. ECC typically refers to logic that detects and may potentially locate, as well as fix errors. As an example, many cache arrays use 1-bit ECC to correct single bit errors per word or cache line.

Figure 1:
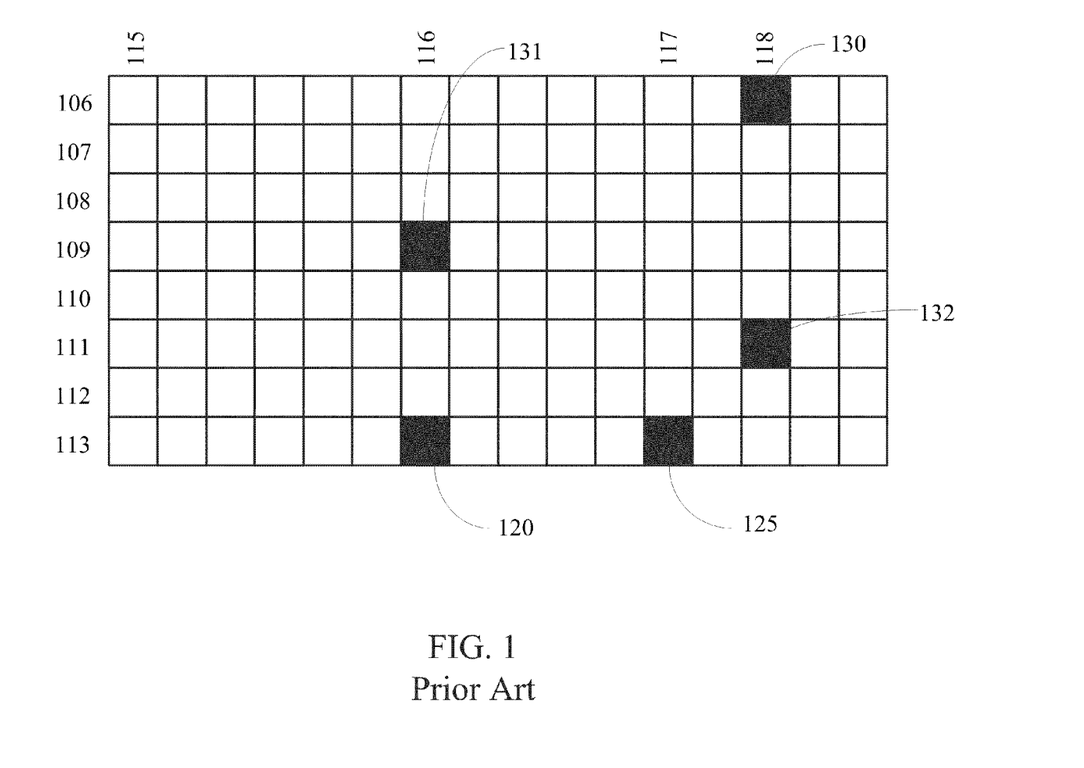
FIG. 1 illustrates an embodiment of a prior art cache array.

Referring to FIG. 1, a prior art cache 100 is illustrated. Often a cache memory is simply a memory array; however, it may also be physically organized or logically viewed as having a plurality of lines/words, such as lines 106 through 113. In addition, each bit or group of bits in every line of the cache are logically viewable to form a column, such as columns, 115, 116, 117, and 118. Assuming cache 100 includes 1-bit ECC, then single errors per line, such as bit-error 130 in cache line 106, bit error 131 in cache line 109, and bit error 132 in cache line 111 may be detected and fixed.

However, as voltages to cache 100 are decreased below a critical voltage certain bits begin to fail. Therefore, to ensure reliability in cache 100 the voltage supplied to cache 100 may only be lowered to a critical voltage before lines, such as cache line 113, begin to have multiple bit errors, such as bit errors 120 and 125. As a consequence, voltage is not decreased any further to ensure reliability; however, this is at the expense of sacrificing power savings.

BRIEF DESCRIPTION OF THE DRAWINGS

The present invention is illustrated by way of example and not intended to be limited by the figures of the accompanying drawings.

DETAILED DESCRIPTION

In the following description, numerous specific details are set forth such as examples of specific cache organizations, cache placements, cache sizes, etc. in order to provide a thorough understanding of the present invention. It will be apparent, however, to one skilled in the art that these specific details need not be employed to practice the present invention. In other instances, well known components or methods, such as error correction, cache design, and cache interfaces, have not been described in detail in order to avoid unnecessarily obscuring the present invention.

The method and apparatus described herein are for repairing cache memories/arrays. In one embodiment, a cache is implemented on a processing device, such as a microprocessor, an embedded processor, a cell processor, or other integer or floating point execution device. However, the methods and apparatus for repairing a cache are not so limited, as they may be implemented on or in association with any integrated circuit device.

An Embodiment of a Processor

Figure 2:
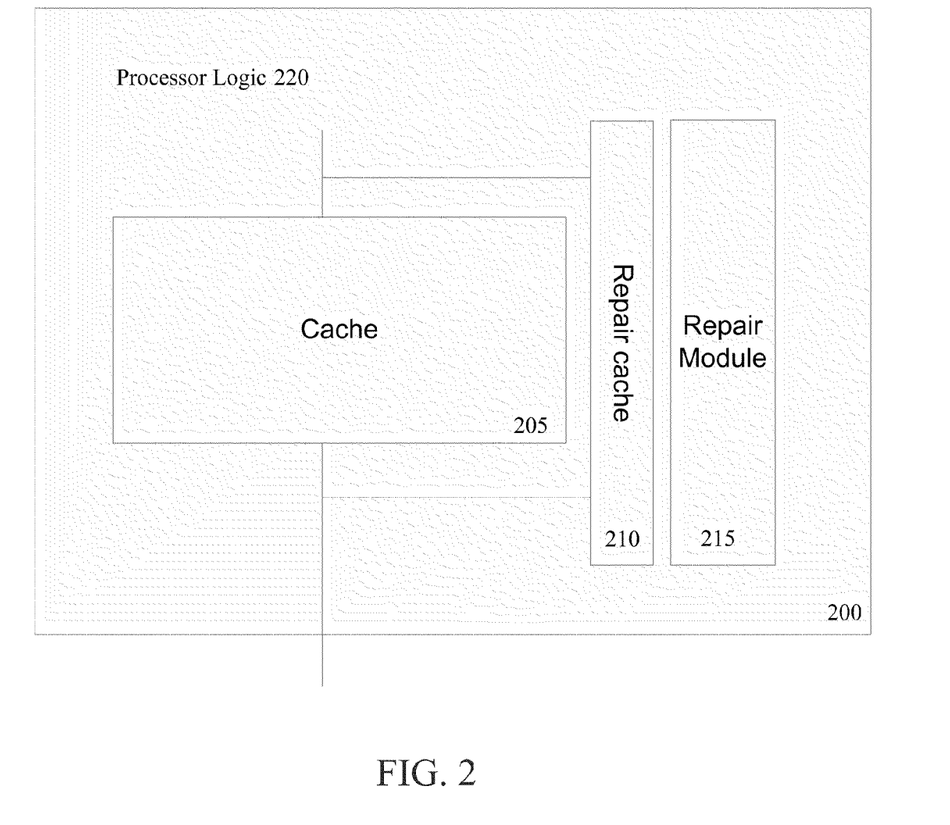
FIG. 2 illustrates an embodiment of a processor including a cache, a repair cache, and a repair module.

FIG. 2 illustrates a processor 200 including processor logic 220, cache 205, repair cache 210, and repair module 215. Processor logic 220 may include any logic for execution of instructions or operation on data. In one embodiment, processor logic 220 includes logic to execute integer and floating point data out of order and in parallel. As another illustrative example, processor logic 220 includes interface logic to interface with external devices, front-end logic to fetch and decode data or instructions, out-of-order logic to assist in out-of-order execution of instructions, and at least an execution unit to execute instructions and/or operate on data.

Cache 205 includes any cache memory array associated with processor 200 including a low-level cache, such as a level-one cache, a mid-level cache, such as a trace cache or level-two cache, or a higher level cache, such as a level-three cache. Although, cache 205, repair cache 210, and repair module 215 are illustrated in processor 200, each may be integrated within one another, as well as located off processor 200. As an example, repair module 215 is implemented in repair cache 210. Any module, such as module 215, may be implemented in hardware, software, firmware, or any combination thereof. Commonly, module boundaries vary and functions are implemented together, as well as separately in different embodiments. Repair cache 210 is to repair cache locations in cache 205 as determined by repair module 215. Repair cache 210 and module 215 are discussed in more detail in reference to FIGS. 4*a*, 4*b* and 5.

Physical and Logical Organization of a Cache

Figure 3:
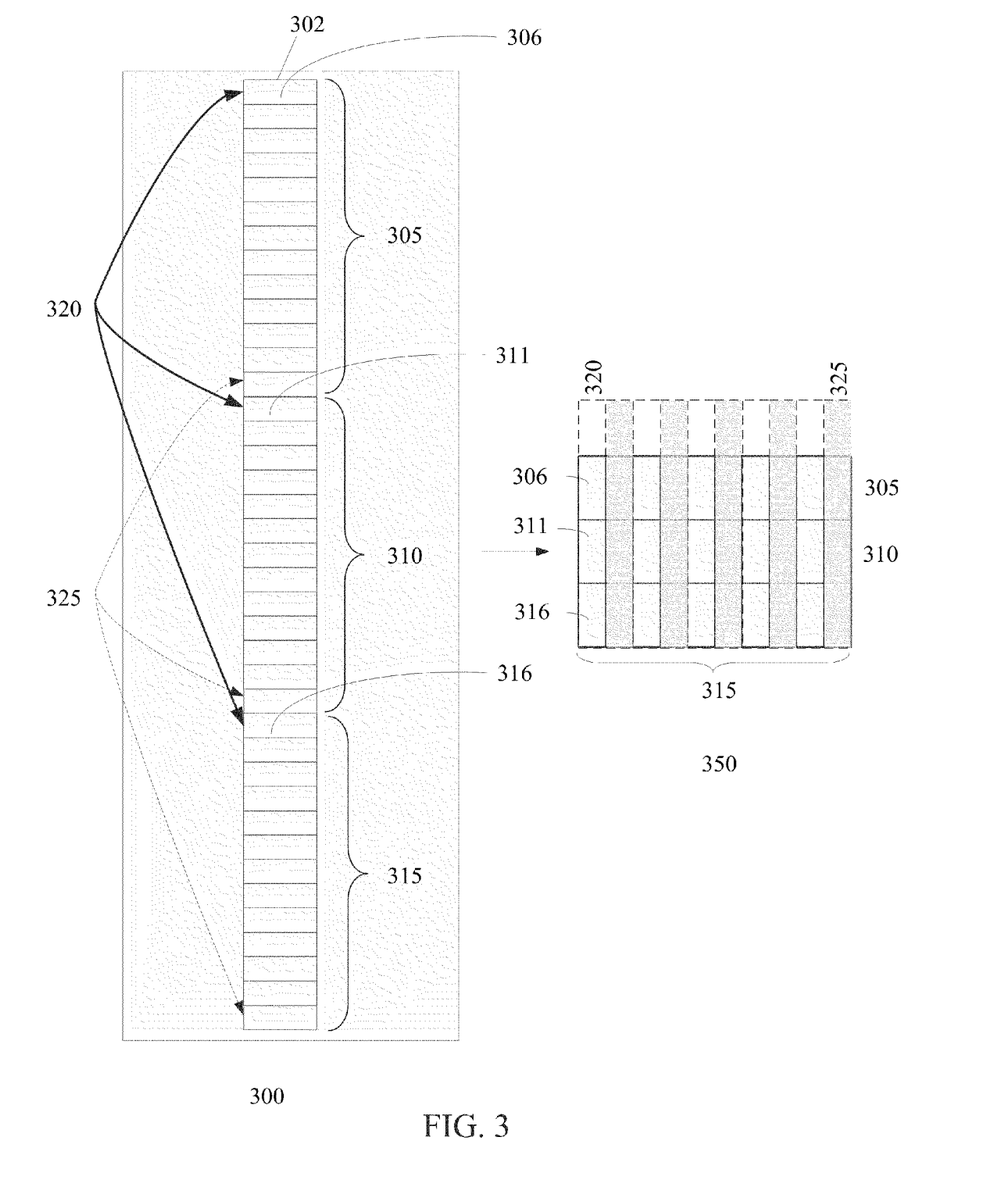
FIG. 3 illustrates embodiments of physical and logically viewable organizations of a cache array.

Turning to FIG. 3, the organization of a cache array 302 is illustrated. Often, a cache is physically organized as an array. Cache array 302 is illustrated as a one-dimensional array; however, caches may be multi-dimensional and physically organized in any manner. Yet, logically caches are viewable as having a plurality of sets, ways, lines/words, columns, and cells/bits. Furthermore, a cache location refers to any granularity of breaking down a cache word/line. For example, a cache location includes a single bit, or in the alternative, refers to a grouping of bits. Cache 302 includes any type of memory, such as a random access memory (RAM) device or static RAM (SRAM device, used as an intermediary storage for data or instructions.

Traditionally, there have been three types of cache organizations that have been used: the fully associative, the k-way set associative; and the direct mapped cache organizations. In a fully associative cache, any line of main memory is stored in any cache entry, making cache comparison complex. In a set associative cache, the cache is typically logically broken into ways, where locations from main memory are stored in specific predetermined locations within each way, which simplifies the cache lookup process. The locations within each of the ways that a main memory location may be stored are often logically grouped together and referred to as a set. A direct mapped cache, which is effectively a one way set associative cache, has one location where a plurality of memory locations with common addressing attributes are potentially stored.

To simplify the discussion of rows and columns within a cache, it is assumed that array 302 is logically viewable as a single way with cache lines/words 305, 310, and 315. Each of cache lines, 305, 310, and 315 having a plurality of bits, such as bits 306, 311, and 316. Physical view 300 illustrates the cache lines physically organized as a one-dimensional array. Logical view 350 illustrates a row and column configuration, where cache lines 305, 310, and 315 are the rows and each of the bits in the same position of the cache lines form a column. As examples, column 320 includes first bits 306, 311, and 316 from cache lines 305, 310, and 315.

As another example, array 302 is logically organized into M rows and N columns. Typically, a cache has any integer number of M rows and has a multiple of 16 for N bits in each row. However, a cache is not so limited, as M and N may be any positive integer. As noted above, a cache may be both physically and logically organized in a different manner than illustrated in FIG. 3. In fact, an example of a set associative cache is illustrated in and discussed in reference to FIG. 5.

An Embodiment of a Repair Cache

Figure 4A:
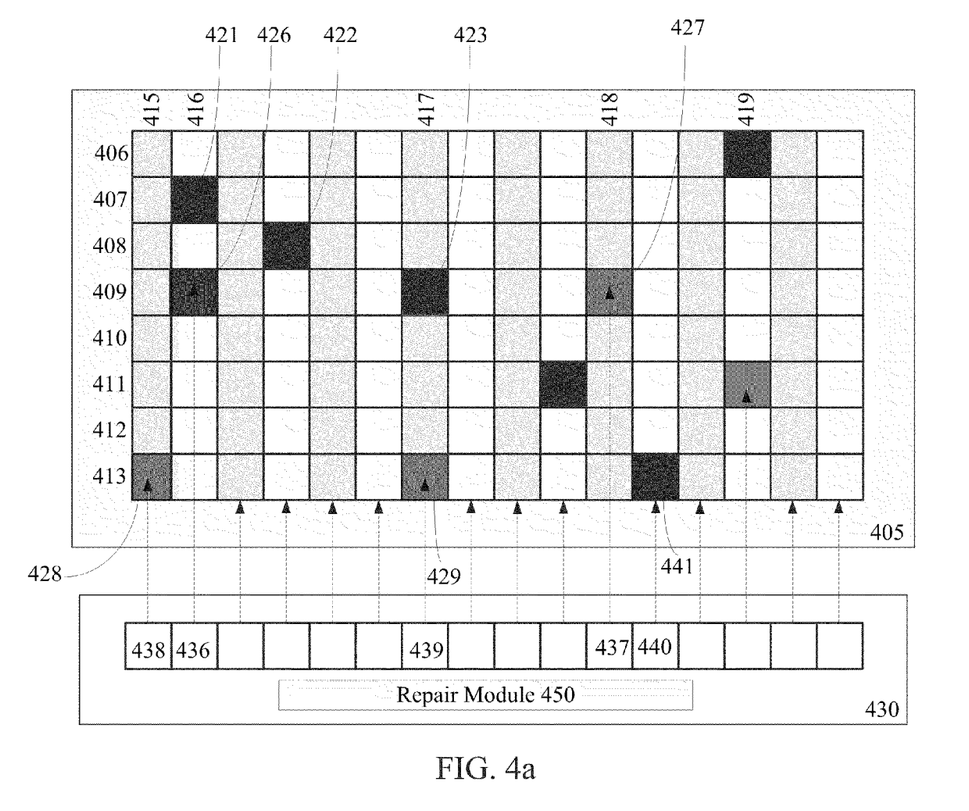
FIG. 4*a* illustrates an embodiment of a repair cache to repair a plurality of errors in a cache.

Turning next to FIG. 4a, a cache 405 and a repair cache 430 is illustrated. Cache 405 has a plurality of words 406-413, which are also referred to as lines, rows, or elements. As stated above, in reference to FIG. 3, each bit of words 406-413 that have the same position or offset within their respective word is logically viewable or logically organized as a column. For example, column 415 includes the first bit within each of rows 406 through 413, while column 416 includes the second bit of lines 406-413.

As illustrated, cache 405 includes some errors, such as at locations 421-423 and 426-429. These errors may be either hard errors, soft errors, or a combination of hard and soft errors. A hard error is where a bit or cache location fails due to some manufacturing, hardware, or design defect. A soft error may also include predictable errors due to manufacturing defects, as well as random errors less likely to affect the same location twice, such as the cosmic flipping of a bit due to a low voltage supply. Cache 405 also depicts repaired locations 426, 427, 428, and 429. Repaired locations 426-429 are discussed in more detail in reference to repair cache 430.

Repair cache 430, although illustrated separate from and coupled to cache 405, is not so limited. In fact, in one embodiment repair cache 430 is implemented in cache 405. Repair cache 430 includes a plurality of "ways." Similar to a cache organization scheme broken into sets and ways, a way in repair cache 430 includes at least one bit or location mapped to a column in cache 405. As a simplified illustrative example, assume that each line of cache is 128-bits wide, then repair cache 430 includes 128 ways. It is also worth noting that repair cache 430 is not required to have the same number of ways as bits in cache 405. As an example, a repair cache includes 64 ways, even though, a cache associated with the repair cache has a line width of 128-bits. In that example, each way of the repair cache is associated with or mapped to two columns of the cache. In the example in FIG. 4a, each way in repair cache 430 has 1-bit; however, each way in repair cache 430 may instead include a plurality of bits, as shown later in FIG. 5.

Associating Repair Ways/Bits with Columns of a Cache

Ways within repair cache 430 are associated with the logically viewable columns/vertical stripes in cache 405. For simplicity, FIG. 4a illustrates each way in repair cache 430 only having one bit, such as the first way including bit 438 and the second way including bit 436. Bit 438 is associated with column 415 of cache 405. In one embodiment, column 415 is directly mapped to bit 438. As a consequence, errors within column 415 are mapped to and repaired by bit 438.

In an embodiment where a different number of ways or a plurality of bits in each way are used, other well-known mapping techniques and replacement algorithms may be used to associate a way with a column. In one example, a last used or time replacement algorithm is used to select a repair bit to repair an error in a cache. Other examples are discussed below in reference to FIG. 5.

Association of a repair bit or repair way to a logically viewable column of a cache may be implemented in any module. In one embodiment, repair bit 438 is associated with column 415 through hardware, where repair bit 438 is physically associated with the addresses or portion of addresses referencing column 415. In another embodiment, repair bit 438 is associated with column 415 through a combination of hardware and software. As an example, specific bits of a physical or a virtual address that reference the locations in column 415 are used to associate bit 438 with column 415. Therefore, when there is an access that references those specific bits the correct repair bit 438 is used to repair the location. As another example, when repair bit 438 is used to repair a location in column 415, such as repaired location 428, a lookup table associates repair bit 438 with location column 415 and location 428.

Determining a Location to Repair

Determining or targeting a location or bit to repair within a cache, such as cache 405 may be based on any number of factors or considerations. Often, in determining a location or bit to repair, it is first determined whether there is an error at a bit or location. Cache 405, as discussed above, illustrates a number of cells with errors, such as bit 421, 422, and 423, as well as bits 426-429. As stated above, errors 421-423 and 426-429 include hard errors, soft errors, or a combination of both hard and soft errors. A hard error is relatively easy to detect, as some hardware or manufacturing defect, tends to induce an error consistently. However, a soft error is usually more difficult to detect, as one time the bit or location is valid and the next time it is accessed there is an error. This is especially true when the voltage supplied to a cache is lowered near a cache location's critical voltage, where certain locations begin to fail.

As a consequence, determining if a location or bit has an error initially may also be based on a number of factors. In a first embodiment, any cell that produces a flipped bit or an error value is determined to be a bad bit or erred bit. In another embodiment, a less rigid policy is used to detect and determined failed bits. As an example, predictive failure analysis is used to determine if a bit is in error. Here, the number of times a bit or location fails is tracked, i.e. the failure rate of the bit. After a predetermined number of failures or a high enough failure rate, the bit is determined to be a bad or failed bit to be repaired. This potentially avoids labeling a bit as a failed bit or error bit upon too few or too many failures. Other well-known error detection methods, not specifically described herein as to not obscure the invention, may be used to detect and/or identify bad cache locations.

When a plurality of bits, such as bits 421-423 and 426-429, are considered erred or failed bits, then a bit or plurality of bits is/are targeted to be repaired. Repairing of bits in a cache is discussed in more detail in reference to FIG. 5. In one embodiment, an optimal configuration of bits to be repaired is determined. As stated above, a number of factors, such as the location of a bit in a word and column, the failure rate of the bit, the predictive analysis of the failure rate of the bit, the number of errors per word, the number of errors correctable per word, optimizing error correction per word, and other well-known considerations for correcting or repairing a cache location are used to determine an optimal configuration of bits to be repaired. In determining a bit to repair each of these considerations may be taken into account individually or in combination with each other.

As a specific illustrative example, assume cache 405 implements single-bit error correction code (ECC). Therefore, 1-bit per word or row is correctable by ECC. Previously, a part, such as a cache, with two bad bits in a single cache line would make the part unusable, as single bit correct ECC could not recover the correct data. However, utilizing repair cache 430 the voltage may be lowered and more errors per word are repaired. In this example, cache line 409 and 413 each have three bit-errors. Therefore, to reduce the number of errors per cache line to a correctable amount, which is 1-bit from the implemented 1-bit ECC in this example, two bits in both lines 409 and 413 of the cache are repaired. Note that in column 416, bit 426 is repaired by repair bit 436, instead of repairing bit 421. Bit 426 is targeted to be repaired based on the number of errors per word and the number of errors correctable per word. Specifically, if repair bit 436 was used to repair bit 421 instead, then word 409 would have three errors, only one of which, bit 427, is repaired. Consequently, 1-bit ECC would not be able to correct both errors and there would be a failure in an access to word 409.

In the alternative, if cache 405 implemented multi-bit correcting ECC, such as X-bit error correction, then an optimal configuration of bits to repair is determined to reduce the number of errors per word of cache 405 to X errors. Specifically, if 2-bit correcting ECC is implemented, then optimizing error correction per word includes reducing the number of errors per word to 2 or less. Yet, determining a bit to repair may be based on the aforementioned considerations in a hierarchal manner, as well. In one embodiment, the first level consideration is to reduce the number of errors per word of the cache to two errors. At a second level, where there is an equal choice between repairing two bits, the choice is based on other secondary factors.

To illustrate, notice that either bit 423 or bit 429 in column 417 are candidates to be repaired by repair bit 439. In the alternative to the embodiment illustrated, where repair bit 439 repairs bit 429, repair bit 439 instead repairs bit 423. To compensate for this change, repair bit 440 repairs bit 441 to keep only 1-bit error in line 413. Therefore, to choose between bits 423 and 429, other secondary considerations, such as failure rate, are used to determine which bit to repair. To further the example, assume that bit 429 failed 20 times (75% of the time) and bit 423 failed 5 times (20% of the time), then either bit is selected to be repaired based on the number of failures or their failure rates. Note that not every error or bit needs be repaired, as a number of errors correctable by ECC may still remain.

These aforementioned embodiments and examples are purely exemplarily, as demonstrated by the fact that cache 405 may implement a multi-bit ECC or need not implement any level of ECC, as well as determine bits to be bad/failed bits by any known method or target bits to be repaired based on any number of factors.

Module 450, which is used to determine bits to repair within cache 405, although depicted in repair cache 430, may be implemented in cache 405, repair cache 430, a processor including cache 405 and repair cache 430, or any combination thereof. Module 450 includes any hardware, software, firmware, code, circuits or combination thereof to determine bits to repair within cache 405. Any module, such as module 450, may be implemented in hardware, software, firmware, or any combination thereof. Commonly, module boundaries vary and functions are implemented together, as well as separately in different embodiments. Firmware often refers to a combination of hardware and software/microcode routines to perform a function.

In one embodiment of module 450, logic in cache 405 including ECC is used to determine which bits have failed, while firmware in repair cache 430 tracks the number of failures and/or failure rate of the bits and targets which bits to repair based on the number of errors per word and the failure rate. In another embodiment, firmware purely associated with repair cache 430 solely determines bits in cache 405 to repair.

As another simplified illustrative example of module 450, firmware tracks failures of bits in cache 405. A firmware routine determines bits to repair from an algorithm, based on any individual or combination of the aforementioned factors, such as number of errors per word, number of errors correctable per word, failure rate, and other considerations. In addition, the firmware stores a lookup table to associate any combination of the following with each other: a cache location/bit to be repaired, a cache line/word including the cache location/bit to be repaired, a repair location/bit, or a column of the cache including the cache location/bit to be repaired. As discussed below, a lookup table potentially assists in the repairing of cache locations upon accesses to the cache.

Repairing Cache Locations

As noted above in reference to FIG. 4a, a repair cache or repair module, such as repair cache 430 and repair module 450, repairs bits in a cache, such as cache 405, with repair bits, such as repair bits 436-440, associated with the columns in cache 405 that include the bits to be repaired. Repairing a bit in cache 405 with a repair bit in repair cache 430 includes replacing the bit to be repaired with the repair bit, storing values to be stored in the bit to be repaired in the repair bit, providing the contents of the repair bit in place of the bit to be repaired, or otherwise assisting in the repair of the bit to be repaired in the cache.

In one embodiment, repairing a bit in a cache using a repair bit includes determining if a request to a cache references a word in the cache including a bit to be repaired and replacing logical information to be read from the bit in the cache with logical information stored in the repair bit. As an example, assume repair bit 428 is targeted to be repaired. Then either the contents of bit 428 are copied to bit 438 or upon a previous write to line 413 the bit to be stored in bit 428 was stored in bit 438. Therefore, if a read to line 413 is requested, then bit 428 is repaired by reading the value the logical value stored in repair bit 438 upon fulfilling the read. From a different perspective, the device requesting the read receives cache line 413 from cache 405 with the bit from repair location 438, instead of the bit stored in location 428, as location 428 is targeted as bad location with potentially incorrect information.

In another embodiment, repairing a bit in a cache using a repair bit includes determining if a request to a cache references a word in the cache including a bit to be repaired and writing/storing logical information to be written to the bit in the cache to the repair bit. As an example, assume repair bit 426 is targeted to be repaired. Therefore, if there is a write to word 409, then bit 426 is repaired by writing the value to be written to bit 426 to repair bit 436. From a different perspective, the device writing writes to word 409 in cache 405, and the bit to be written to location 426 is written to repair location 436.

As can be seen from above, repair cache 430 may operate transparently as viewed from cache 405's perspective, as well as operate non-transparently as an intermediary.

In one embodiment, repair cache 430 and associated logic act as an intermediary between a device accessing cache 405 and cache 405. In this embodiment, repair cache 430 would receive all requests, such as reads and writes, and repair the cache location during the read and write operations. For example, if a device requests a read from line 413 of cache 405, then repair cache 430 would intercept the request and upon fulfilling the request would provide the contents of cache line 413 to the requested device with bit 428 replaced by repair bit 438 and bit 429 replaced by bit 439.

However, acting as an intermediary may potentially slow down certain cache access times. For example, upon an access to cache line 406, where no bits are repaired by repair cache 430, there would be no reason for repair cache to intercept and forward the request.

Consequently, in another embodiment, repair cache 430 repairs bits in cache 405 transparently. Repair cache 430 operating transparently is illustrated by contrasting from the example above. Upon an access to cache line 413, repair cache 430 looks at the location referenced by the request, instead of intercepting the request and forwarding it on. If the request is a read and references cache line 413, then upon fulfilling the request, cache line 413 is sent out of cache 405 and repair cache 430 replaces cache location 428 with repair bit 438 and cache location 429 with repair bit 439. As can be seen, the operation of repair cache 430 is essentially transparent to cache 405, as cache 405 received the request and fulfilled the request unaffected by repair cache's replacement of bits 428 and 429. In addition, upon a write to cache line 413, the write continues as it would before, with respect to cache 405, as all values are written into cache 405. However, the values for cache location 428 and 429 are also written into repair locations 438 and 439.

As mentioned above, in one embodiment, module 450 may track which bit within cache 405 a repair bit in repair cache 430 is to repair. For example, in a lookup table, such as lookup table 460 illustrated in FIG. 4*b*, the repair bits, listed in column 465, are associated with the bits they repair in cache 405, which are listed as corresponding entries in column 470. Therefore, when an access references cache line 413 including locations 428 and 429, by checking lookup table 460 it is able to be determined that bits 428 and 429 are targeted to be repaired. In addition, table 460 includes the information that they are to be repaired by bits 438 and 439.

Figure 4B:
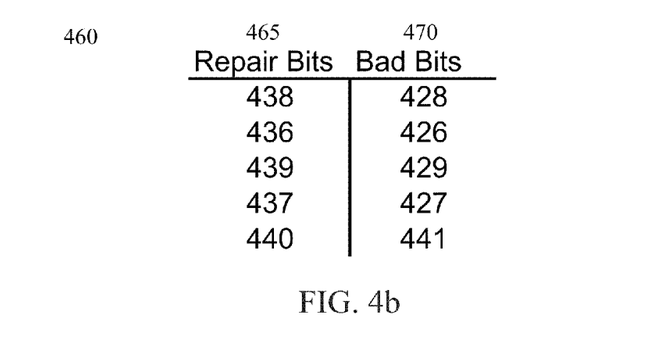
FIG. 4*b* illustrates an embodiment of a look-up table.

However, module 450 is not limited to the specific implementation of lookup table 460 as shown in FIG. 4*b*. For example, the lookup table may include references to addresses of cache lines either in addition to the bits listed in column 470 or instead of bits listed in column 470. In another embodiment, the table includes all of the repair bits in repair cache 430 and either sets a flag bit or writes a corresponding bit location when a bit is to be repaired. In the alternative, as illustrated in FIG. 4*b*, entries are only created in table 460, when a repair bit is to repair a bad location.

As another illustrative example, assume that bit 426 in cache 405 is determined by module 450 to be a bit in need of repair. Assume further that module 450 determined to repair bit 426, because ECC has detected and firmware has tracked bit 426 having a high failure rate. Additionally, line 409, which includes bit 426, has two other errors and only 1-bit ECC is implemented. As a result, module 450 stores in a table a starting address and a size of cache line 409, the address of bit 426, and the address of repair bit 436, since repair bit 436 is associated with column 416. Therefore, upon an access to cache line 409, the table is checked and it is determined that cache line 409 is referenced. Upon fulfilling the request, module 405 repairs bit 426 with repair bit 436, since they are associated with the cache line in the table. As a modification, multiple cache locations and repair bits are associated with cache lines.

As an illustrative example, the example above demonstrates that vast possibilities of repair module 450 and lookup table 460. For example, table 460 through hardware, software, firmware, or a combination thereof may associate each of the following with each other to aide in repair of cache locations: a cache location/bit to be repaired, a cache line/word including the cache location/bit to be repaired, a repair location/bit, or a column of the cache including the cache location/bit to be repaired. Also note that addresses, reference to addresses, portions of addresses, or other representations of the foregoing items to be associated may be stored.

An Embodiment of a Repair Cache in a System

Figure 5:
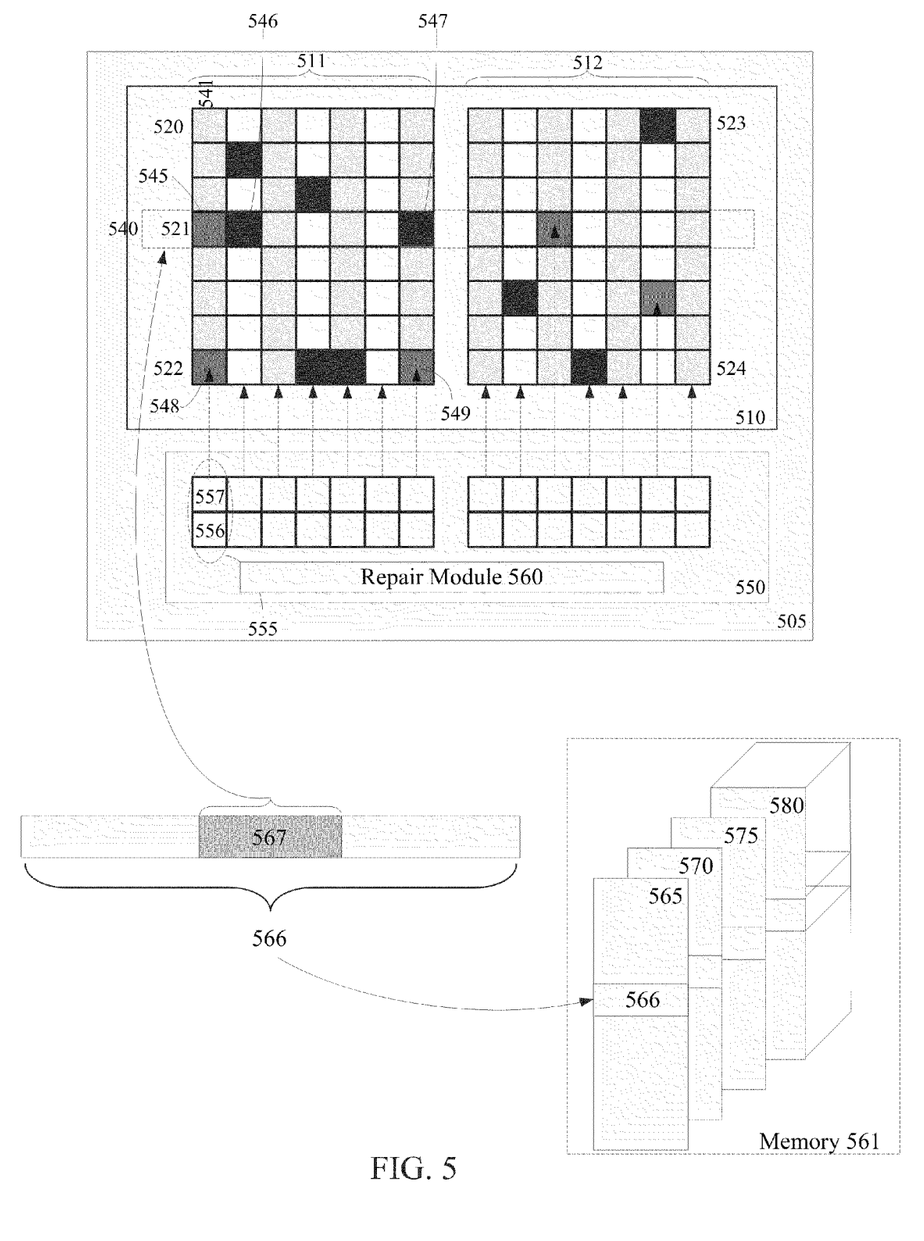
FIG. 5 illustrates an embodiment of a repair cache to repair errors in a cache array with a plurality of sets and ways.

Turning to FIG. 5 a system having a microprocessor 505 coupled to a memory 561 is illustrated. Although not illustrated, a controller hub or other integrated circuit/device is potentially coupled between memory 561 and microprocessor 505. Microprocessor 505 includes any logic or modules for operating on data and executing instructions. As illustrated microprocessor 505 includes cache 510 and repair cache 550. Microprocessor 505 may also include other processing logic to execute instructions, operate on data, or communicate with external devices.

In the example shown, cache 510 is illustrated as a two-way set associative cache; however, cache 510 may be organized as a direct mapped cache, an associative cache, a fully associative cache, a set-associative cache, or a way-associative cache. Often main memory array 561 is logically broken up into pages, such as pages 565-580. Main memory 561 includes any memory bank or array, such as a random access memory (RAM), a static random access memory (SRAM), a dynamic RAM (DRAM), or other main memory device.

A location within page 561 of memory, such as location 566 within page 565, is referenced by a main memory address 566. Within address 566 there are certain bits that are the same for each location within page 565, as well as some bits that designate the offset of location 566 within page 565, i.e. the page offset value. A section 567 of address 566, which is also referred to as a tag value, is commonly used to map location 566 to a set within cache 510, such as set 540. In fact, either page 565, or alternatively, the locations with the same offset in each of pages 565-580 may be mapped to a set by section

567. Set 540 includes a cache line in first way 511 and a cache line in second way 512 that address location 566 is mapped to. Therefore, upon a request to main memory location 566, the cache need only check set 540 to see if a copy of memory location 566 exists. Each way in cache 510 includes M lines, where each line includes N bits. In FIG. 5, M and N are illustrated as 8 lines per way and 7 bits per line, respectively.

Repair cache 550 is illustrated coupled to cache 510. Repair cache 550 includes 14 ways, which is 1-way for each of the N bits of the M lines of cache 510, where each one of the ways is associated with at least one of the N bits. As stated above, in another embodiment a repair cache is implemented using 7-ways, where each way has two bits and is mapped to two columns of cache 510. However, as shown, repair cache 550 includes 14 ways, each way having two bits and being associated with a column of cache 510. For example, way 555 includes bit 556 and bit 557 and is associated with column 541.

In one embodiment, cache 510 implements ECC. As an illustrative example, cache 510 implements 2-bit ECC with the capability of correcting two bits per line of cache 510. Line 521 includes three failed bits, bits 545-547, which all cannot be corrected by two-bit ECC. Therefore, repair bit 556 in way 555 associated with column 541, is used to repair bit 545. Furthermore, line 522 includes four bad bits. As a result, the second bit in way 555, repair bit 557, is used to repair cache location 548.

Repair cache 550 also includes repair module 560. As stated above, repair module 560 may be implemented in or across repair cache 550, cache 510, microprocessor 505, or any combination thereof. Repair module 560 associates each way and repair bits with a column of the cache. In one embodiment, way 555 is directly mapped to column 541. In this example, direct mapping of way 555 to column 541 includes repairing only bits in column 545 with repair bits in way 555. An example of mapping includes: associating a portion of addresses identifying the bits in column 541 with the way 555, which may be done through comparison logic, a mapping table, lookup logic, or other common association techniques.

Repair module 560 also determines bits in columns to repair. As described above, repair module 560 selects bits to repair in cache 510 based on an optimal configuration. In determining an optimal configuration and bits to repair any number of factors through an algorithm, software, hardware, or other mechanism may be taken into account, such as the failure rate of bits, the number of errors per cache line, the number of errors correctable per cache line, the type of ECC implemented, the number of repair bits available, the effect of repairing one bit in a column and not repairing another on other cache lines or columns, as well as other considerations. In one embodiment, repair logic 560 dynamically analyzes and re-determines the bits to be corrected based on the aforementioned factors.

In addition, repair module 560 repairs bits determined to be repaired. As stated above, upon a read to a cache line including a bad bit, a repair bit associated with the column of the bad bit is read from the repair bit and replaces the bad bit upon fulfilling the read request. As an example, assume that processor 505 makes a read request referencing main memory address 566, which is mapped to set 540. Cache 510 includes a copy of main memory location 566 in line 521. Repair module 560 determines that bit 545 is to be repaired. As an illustrative example, it is assumed that repair logic 560 had previously determined that bit 545 was a failed bit and created an entry in a table to associate that bad bit 545 is to be repaired by repair bit 557. Cache line 521 is then read out of cache 510 and the value from bad bit 5451 is replaced with the value stored in repair bit 557. In the end, microprocessor 505 receives a valid copy of main memory location 566 from cache 510, as bad bit 545 was replaced with valid information from repair bit 557. Similarly, in a write to cache 510, the value to be written to bad location 545 is written to repair bit 557.

Embodiments for Repairing a Cache Location

Figure 6A:
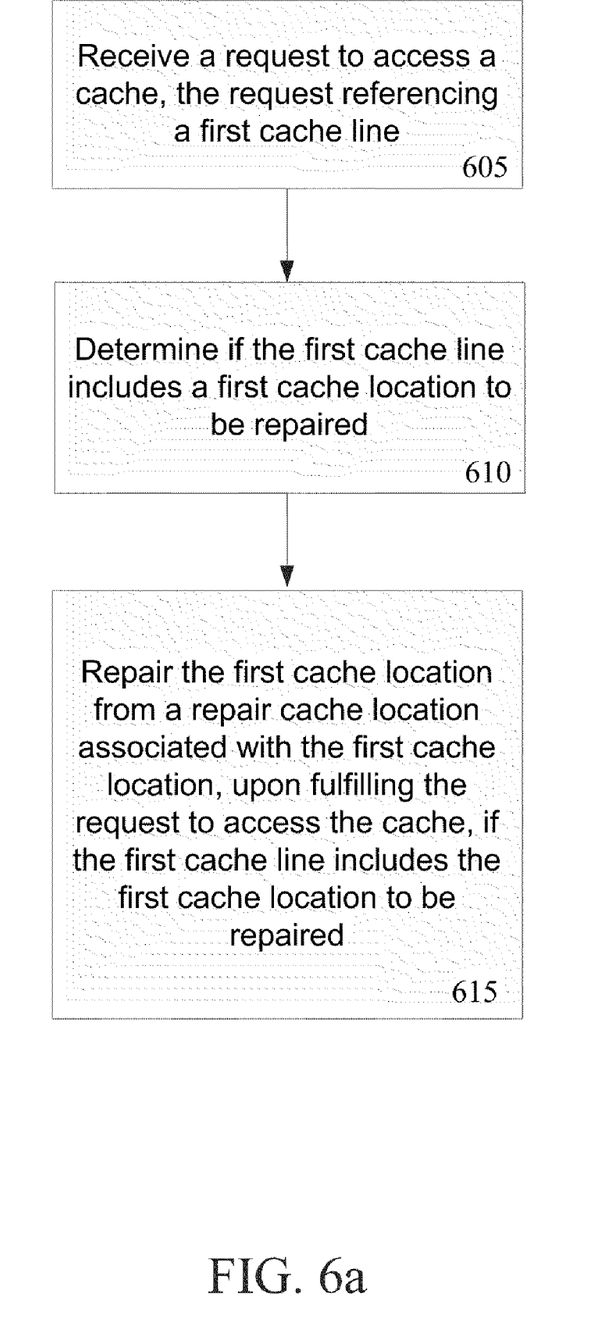
FIG. 6*a* illustrates an embodiment of flow diagram for repairing a cache location.

Referring next to FIG. 6a, an embodiment of a flow diagram for repairing a cache location is illustrated. In block 605, a request to access a cache is received, where the request references a first cache line. As stated above, a request may reference a cache line in a number of ways, including a tag value associated with the cache line, a physical address associated with the cache line, a virtual address associated with the cache line, a physical/virtual main memory address that is copied into the cache line, or any other common method of referencing a word/line of cache.

Next, in block 610, it is determined if the cache line includes a first cache location to be repaired. In one embodiment, a lookup module is used to determine if the cache line includes a first cache location to be repaired. When it is determined that a first cache location is to be repaired, an entry in the lookup module is created or modified to associate a repair location with a cache location and/or a cache line including the cache location. Consequently, upon an access, the lookup module is checked to see if the first cache line includes a first location to be repaired.

In another embodiment, a multiple tier lookup module is used to first determine if the cache line includes any locations to repair. This may be done by listing references to cache lines that include locations to repair in the lookup module. If there are no matching cache lines then there is no need for further analysis. If a cache line is listed/matched then it is determined if the cache location is within the first cache line or which cache locations to repair. This may be done in a number of ways, such as entering the information in the lookup module or using address comparison to determine the cache location is within the address bounds of the cache line.

Other mechanisms and modules may be used to determine if the cache line includes a first cache location to be repaired. For example, firmware may store a reference to cache lines with locations to be repaired. Refer to the repairing cache locations section above for more discussion on determining if the cache line includes a first location to be repaired.

In block 615, if the first cache line includes the first cache location to be repaired, then the first cache location is repaired from the repair cache location associated with the first cache location, upon fulfilling the request to access the cache. As stated above, the first cache location may be associated through a module, which includes a lookup table. In one embodiment, the first cache location is associated with the repair cache location through a mapping of the repair cache location to a logically viewable column that includes the first cache location. Here, the repair cache location is directly mapped to a column of the cache, and upon determining the first cache location is to be repaired, the repair cache location directly mapped to the column including the first cache location is used.

Figure 6B:
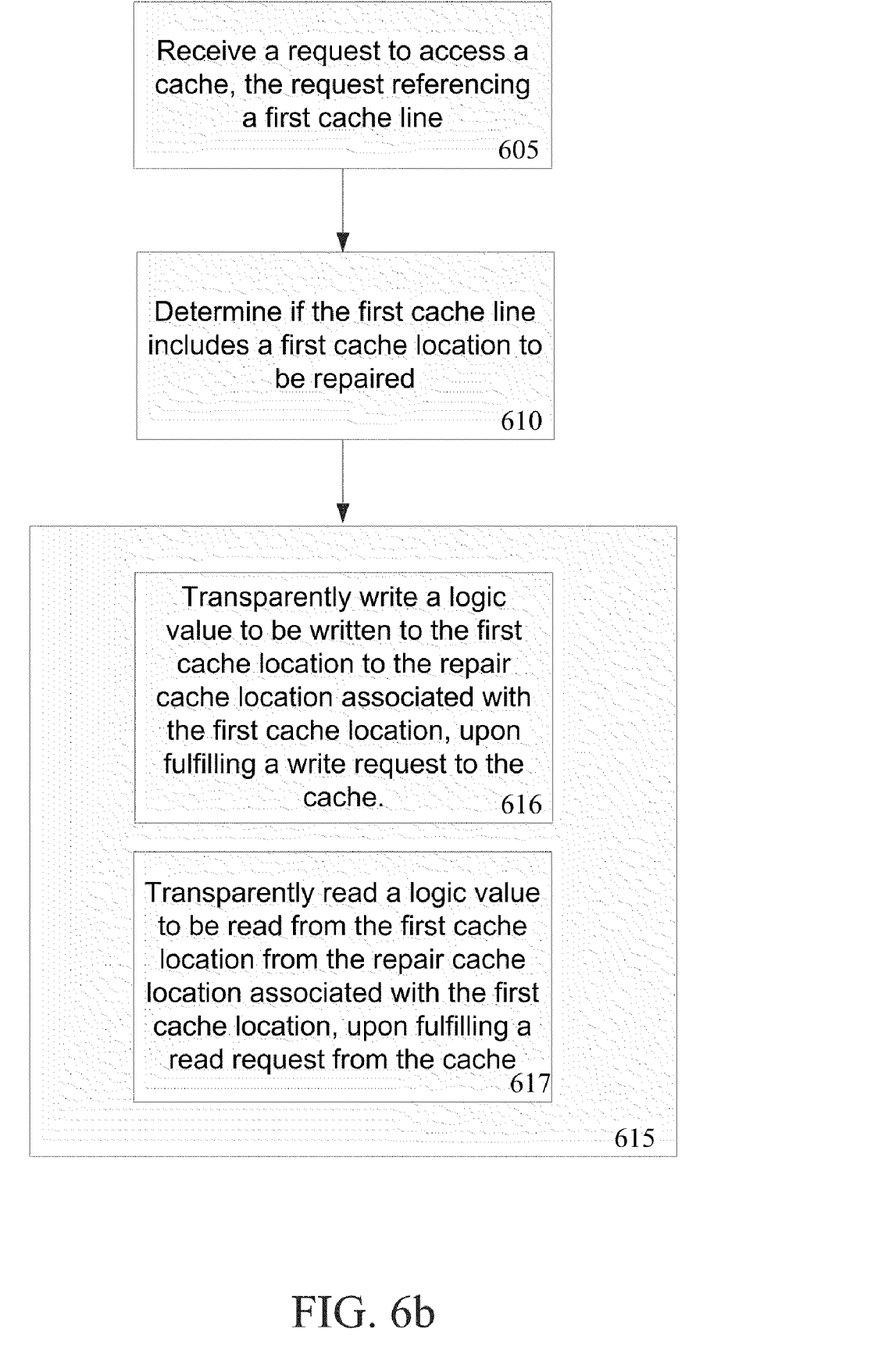
FIG. 6*b* illustrates a specific embodiment of the flow diagram shown in FIG. 6*a* for repairing a cache location.

Turning to FIG. 6b, a specific embodiment of a flow diagram for repairing the first cache location with a repair cache location is illustrated. In block 616, upon fulfilling a write request to the cache, a logic value to be written to the first cache location is transparently written to the repair cache location associated with the first cache location. An example includes, writing to a line of cache, wherein the line of cache has a first bad bit. The write to the cache lines occurs, from the cache's perspective, as normal. However, when it is determined that the write is to a line of cache which includes a bad bit, as in block 610, then the value to be written to the first bad bit is also written to a repair bit mapped to a logical column of the cache including the first bad bit location.

In block 617, upon fulfilling a read request from the cache, a logic value to be read from the first cache location is read from the repair cache location associated with the first cache location. Continuing the example from above, a request for the line of the cache is determined to include the first bad bit location, in block 610. The line of the cache is read and provided by the cache, from the cache's perspective, as fulfilling a normal request. However, the value stored in the repair bit associated with the first bad bit is read from the repair bit location and replaces the value from the first bad bit location. As a result, the cache operates normally, while the data stored and read out for the bad bit is in the repair bit. This perspective from the cache's point of view refers to the transparency of the write/store and the read/replace, as the cache operates normally.

Figure 7:
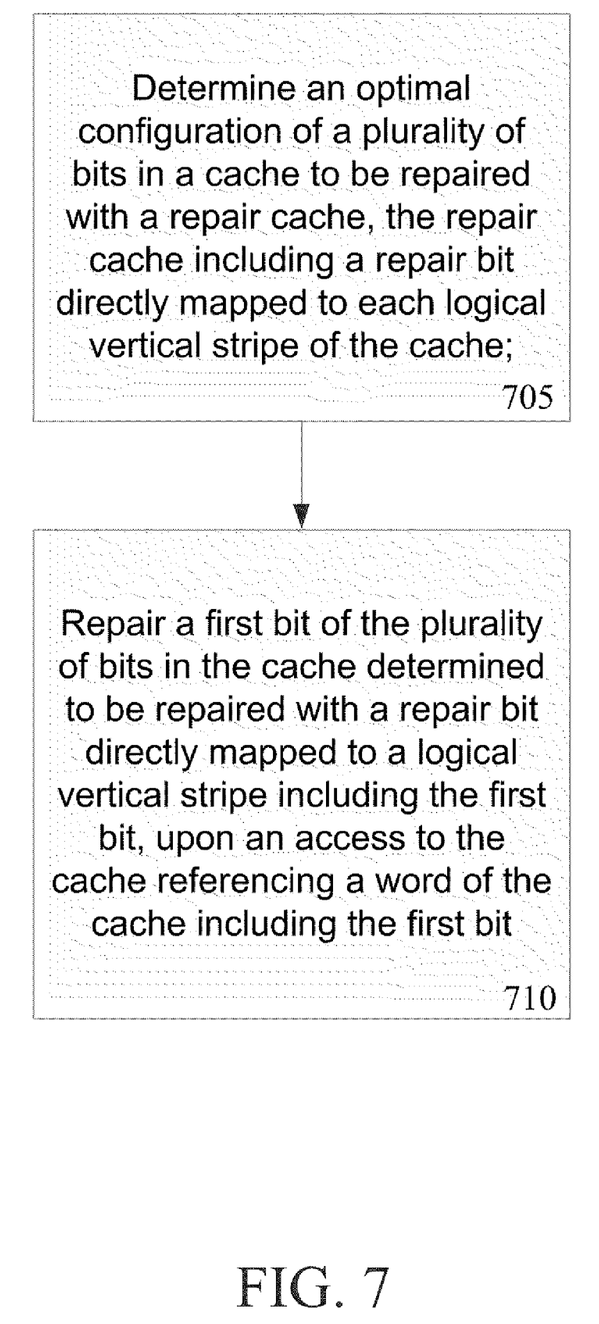
FIG. 7 illustrates an embodiment of a flow diagram for repairing a bit in a cache based on an optimal configuration of a plurality of bits to be repaired in the cache.

Turning to FIG. 7, an embodiment of a flow diagram for repairing a cache based on an optimal configuration of a plurality of bits to be repaired is illustrated. In block 705, an optimal configuration of a plurality of bits in a cache to be repaired with a repair cache is determined. The repair cache includes a repair bit directly mapped to each logical vertical stripe/column of the cache.

As stated above, the cache may have any number of bits determined to be bad bits. As a consequence, a choice of which bits to repair may be made based on any number of factors. In one embodiment, to choose the optimal configuration an algorithm is used that selects a configuration of bits to be repaired based on any one or combination of the following: the failure rate of bits, the number of bad bits per cache line, the number of bad bits correctable per cache line, the type of ECC implemented, the number of repair bits available, and the effect of repairing one bit in a vertical stripe and not repairing another within other cache lines or columns.

In one embodiment, the determination of the optimal configuration of bits is dynamically re-evaluated or dynamically determined. For example, assume it is determined that a first bit is to be repaired based on its failure rate and location within a line with other bad bits. However, if at a different time conditions change, another bit within the same vertical stripe as the first bit may be selected to be repaired instead of the first bit. This allows the repair cache ultimate flexibility in ensuring the most optimal configuration of bits to repair is determined under changing conditions.

Next, in block 710, upon an access to the cache referencing a word of the cache including a first bit, the first bit of the plurality of bits in the cache determined to be repaired with a repair bit directly mapped to a logical vertical stripe including the first bit is repaired. In one embodiment, repairing the first bit of the plurality of bits includes writing a value to be stored in the first bit to the repair bit, if the access to the cache referencing the word including the first bit is a write operation. In another example, repairing the first bit of the plurality of bits includes reading a value stored in the repair bit, if the access to the cache referencing a word of the cache including the first bit is a read operation.

As illustrated above, a repair cache may be used to increases the efficiency and accuracy of a cache, which is run at lower voltages. Previously, a cache would have a lower voltage limit that it could not decrease supply voltage under, as it would cause too many errors per cache line to be corrected by ECC. However, by including a repair cache, errors per logical column of the cache may be repaired allowing the voltage supplied to be decreased without sacrificing the number of errors that are corrected by ECC. Additionally, not every error within a cache is required to be repaired. Potentially, only enough errors to ensure valid data, through usage in combination with correcting ECC, are repaired. Moreover, the bits chosen to be corrected/repaired may dynamically change over time to select a more optimal configuration of repair bits. Consequently, power is saved without sacrificing accuracy of a cache.

In the foregoing specification, a detailed description has been given with reference to specific exemplary embodiments. It will, however, be evident that various modifications and changes may be made thereto without departing from the broader spirit and scope of the invention as set forth in the appended claims. The specification and drawings are, accordingly, to be regarded in an illustrative sense rather than a restrictive sense. Furthermore, the foregoing use of embodiment and other exemplarily language does not necessarily refer to the same embodiment or the same example, but may refer to different and distinct embodiments, as well as potentially the same embodiment.

What is claimed is:

1. An apparatus comprising:
    a memory configured to be logically organized into a M rows and N columns, wherein M and N are positive integers;
    a repair memory having a plurality of replacement bits;
    a correction module configured to correct X errors per each of the M rows of the memory, wherein X is a positive integer; and
    a repair module configured to determine an optimal configuration of errors in the memory array to repair with the plurality of replacement bits, wherein the optimal configuration of errors to repair includes a configuration of errors that is to reduce at least a portion of the M rows to X errors per row.

2. The apparatus of claim 1, wherein the repair module is further configured to repair an error of the optimal configuration of errors determined to be repaired in response to an access to a portion of the memory including the error, wherein the repair module being adapted to repair an error comprises the repair module being adapted to:
    read from a replacement bit of the plurality of replacement bits instead of a location of the error upon the access including a read operation, and
    write to the replacement bit instead of the location of the error upon the access including a write operation.

3. The apparatus of claim 1, wherein the memory array is a cache memory, and wherein the repair array is a repair cache.

4. The apparatus of claim 3, wherein a subset of the plurality of replacement bits is to be only associated with each of the N columns.

5. The apparatus of claim 4, wherein the repair module is further configured to dynamically re-determine the optimal configuration responsive to determining new bits in the M rows include failed bits.

6. An apparatus comprising:
    a cache configured to include a plurality of lines and a plurality of ways;
    a repair module configured to determine an optimal configuration of a plurality of target bits in the cache to be repaired with a repair cache, the optimal configuration being based on reducing cache lines with errors within the cache to a number of correctable bit errors per cache line, wherein the repair module is also to repair a target bit of the plurality of target bits in the cache with a repair bit from the repair cache in response to an access to the cache referencing a line of the cache including the target bit.

7. The apparatus of claim 6, wherein the cache includes two-bit error correction code (ECC), the correctable number of errors per word of the cache is two, and the optimal configuration is based on reducing cache lines to two bit errors per cache line.

8. The apparatus of claim 6, wherein determining an optimal configuration of a plurality of target bits in a cache to be repaired is further based on a failure rate of the plurality of target bits.

9. The apparatus of claim 6, wherein the target bit is to be directly mapped to a column including the target bit, and wherein repairing the target bit of the plurality of target bits comprises:
   writing a value to be stored in the target bit to the repair bit directly mapped to the column including the target bit in response to the access to the cache referencing the line including the target bit being a write operation;
   reading a value stored in the repair bit directly mapped to the column including the target bit in response to the access to the cache referencing a line of the cache including the target bit being a read operation.

10. The apparatus of claim 6, wherein the repair module is to dynamically determine the optimal configuration during runtime.

11. A method comprising:
   determining an optimal configuration of error in a cache to be repaired, wherein the optimal configuration of error includes a pattern of error repaired to reduce cache lines of the cache to a correctable number of errors;
   repairing, with a repair cache, the optimal configuration of error in response to accesses to locations of the cache including the optimal configuration of errors; and
   correcting, with error correction code (ECC), the correctable number of errors per cache line.

12. The method of claim 11, further comprising: dynamically re-determining, during runtime, the optimal configuration of error in a cache to be repaired in response to detecting a new error within the cache.

13. The method of claim 11, wherein the optimal configuration of error further includes a priority for error locations of the pattern with a higher bit failure rate.

14. The method of claim 11, wherein the repair cache includes a plurality of ways, each of the plurality of ways being only associated with one way of the cache.

* * * * *